United States Patent [19]

Rochat et al.

[11] 4,306,343
[45] Dec. 22, 1981

[54] DEVICE AND METHOD FOR THE ASSEMBLY OF CRYSTAL RESONATORS

[75] Inventors: Daniel Rochat, Saint-Blaise; Maurice Jeanmairet, Boudry; Paul Sallaz, Granges; Jean-Jacques Fleuty; Jean-Luc Monnier, both of Neuchatel, all of Switzerland

[73] Assignee: Ebauches S.A., Neuchatel, Switzerland

[21] Appl. No.: 73,516

[22] Filed: Sep. 7, 1979

[30] Foreign Application Priority Data

Sep. 15, 1978 [CH] Switzerland .................. 9661/78

[51] Int. Cl.³ .......................................... H01L 41/22
[52] U.S. Cl. .................................. 29/25.35; 206/330;
206/332; 206/334; 206/564; 220/23.4; 310/348
[58] Field of Search .................. 29/25.35; 310/348;
206/328, 330, 332, 334, 564; 220/23.4, 23.86

[56] References Cited

U.S. PATENT DOCUMENTS

| Re. 29,683 | 6/1978 | Ocken, Jr. .................. 206/328 X |
| 3,913,195 | 10/1975 | Beaver .................... 29/25.35 |
| 4,043,477 | 8/1977 | Deese ..................... 220/23.4 |
| 4,131,816 | 12/1978 | Nakata .................... 310/348 |

Primary Examiner—Carl E. Hall
Attorney, Agent, or Firm—Silverman, Cass & Singer

[57] ABSTRACT

A fabrication procedure for crystal resonators in which belted component holders are used, each accomodating the constituent elements of a resonator. When the above-mentioned elements are assembled, the component holders serve the purpose of assembly fixtures. The assembled resonators are retained in the component holders which thus also provide a packaging function for the final products. The component holders have elastically deformable clamps which accomodate the constituent elements of the resonators to be assembled and have support sections which receive the crystal element of each resonator.

10 Claims, 10 Drawing Figures

U.S. Patent  Dec. 22, 1981  4,306,343
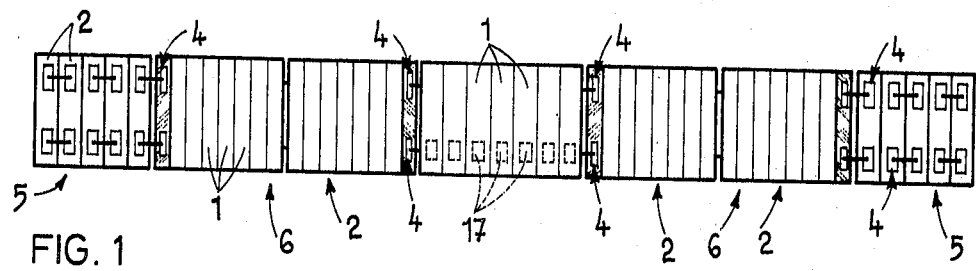
FIG. 1
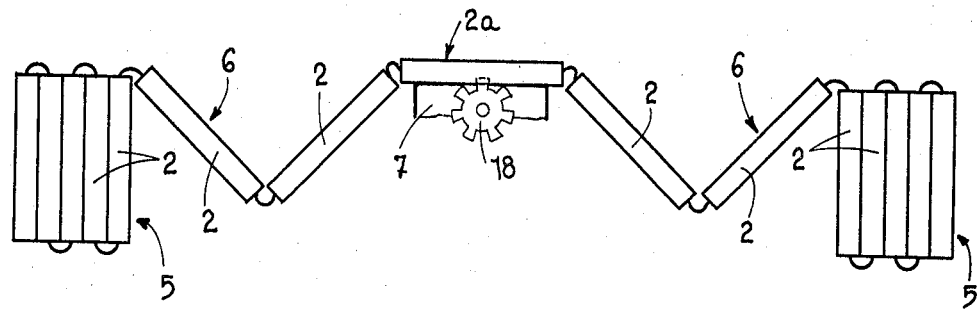
FIG. 2
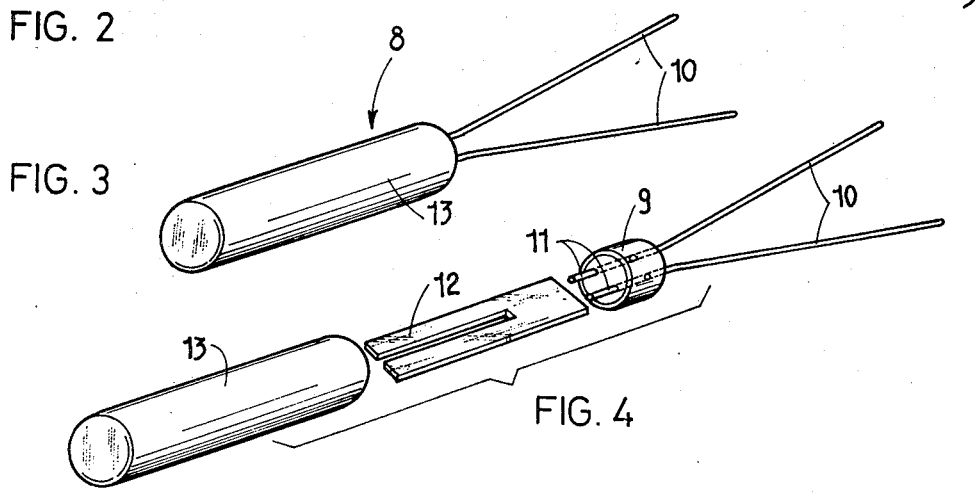
FIG. 3
FIG. 4
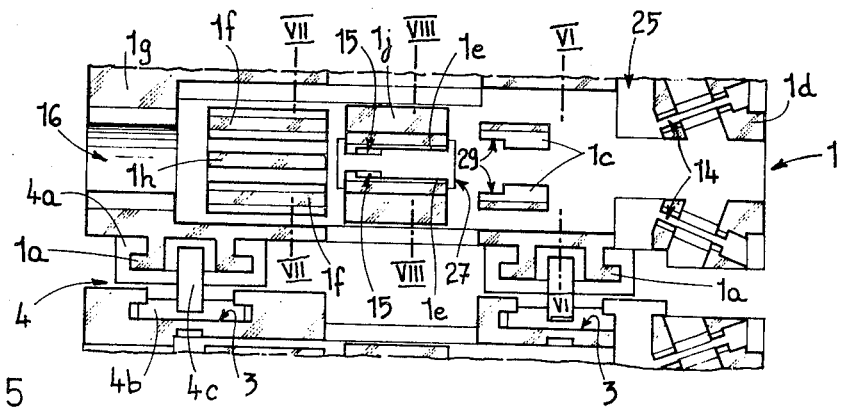
FIG. 5

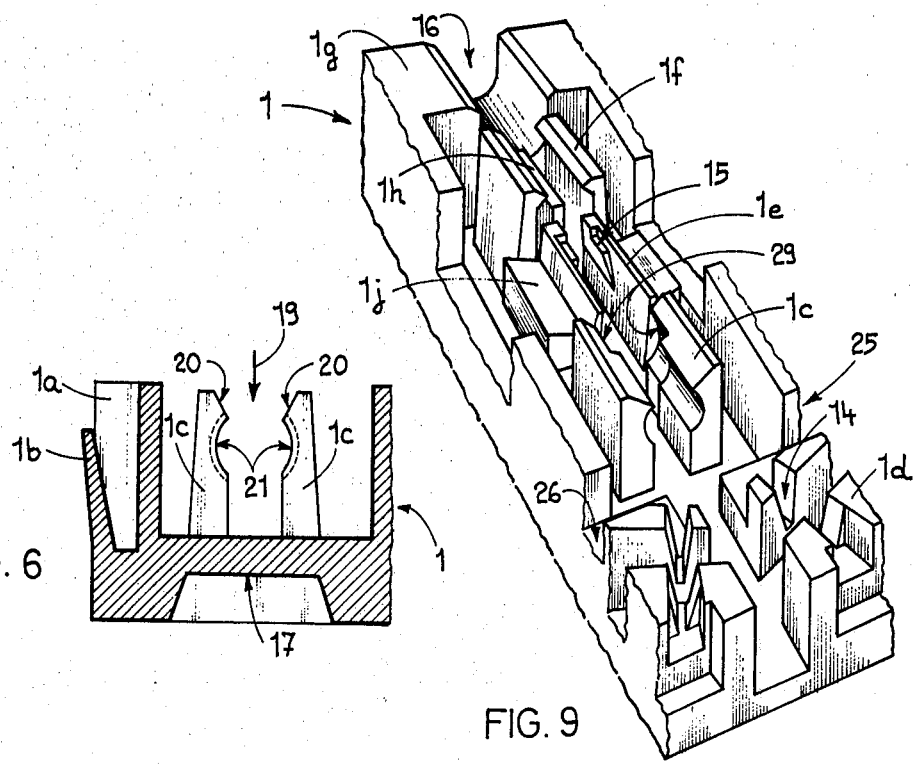
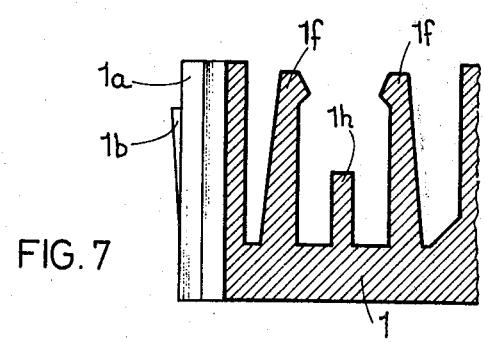
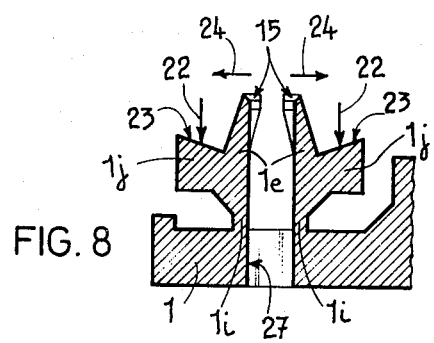
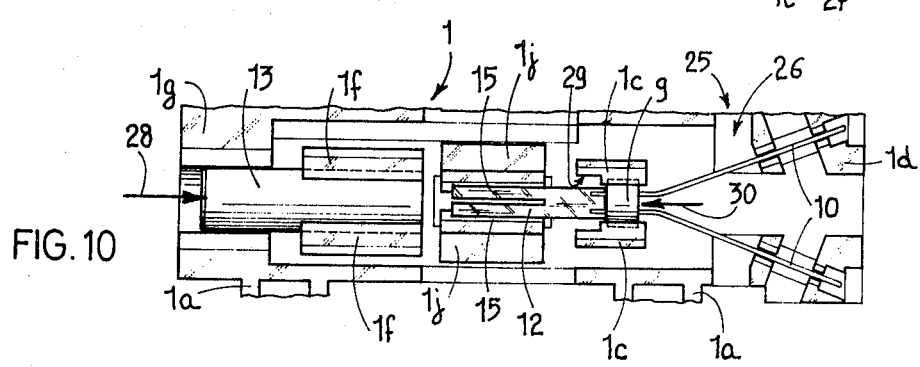

DEVICE AND METHOD FOR THE ASSEMBLY OF CRYSTAL RESONATORS

The invention described herein relates to a method and a device for the assembly of crystal resonators, and to a method for assembling and packaging said resonators.

The purpose of the invention is to supply a means for the assembly of the constituent parts of crystal resonators in such a manner as to facilitate large-series fabrication of such resonators, said devices simultaneously providing packaging functions for the finished resonators.

The drawing represents one possible configuration of the object of this invention.

FIG. 1 is a plan view of a device with which crystal resonators can be manufactured.

FIG. 2 is a side view of the device illustrated in FIG. 1.

FIG. 3 is a perspective view of a crystal resonator.

FIG. 4 is an exploded view of the resonator of FIG. 3 which illustrates the constituent elements of the resonator.

FIG. 5 is a plan view of part of the device including the invention on an enlarged scale.

FIGS. 6, 7, and 8 are cross sections of the device illustrated in FIG. 5 as indicated by the lines VI—VI, VII—VII, and VIII—VIII, respectively, of FIG. 5.

FIG. 9 is a perspective view of another part of the device on an enlarged scale.

FIG. 10 is a plan view of the part of the device shown in FIG. 5 with the respective resonator components in their respective positions.

DESCRIPTION OF THE PREFERRED EMBODIMENT

The device illustrated, made of molded plastic, is composed of component holders 1 which in the example are rigidly connected to form blocks 2 with eight component holders each. Alternatively, the component holders can also be made of metal.

The individual holders 1 or blocks 2 are connected to each other in a chain fashion. For this purpose, each holder at one of its ends has two dovetail tongues 1a (FIG. 5) and at its other end two grooves 3 of a corresponding shape. These tongues and grooves can be engaged directly when rigid assemblies with several component holders 1 or several blocks 2 of component holders are wanted; the tongues and grooves can also accomodate connecting elements such as elements 4 in FIG. 5, each with a part 4a wich engages with tongue 1a of holder 1, a part 4b which engages with a groove 3 of the adjacent holder and a flexible connecting element 4c which holds elements 4a and 4b together. Each tongue 1a has an elastic tab 1b (FIG. 6) which will engage in a corresponding recess not shown in part 4a of the connecting element or the wall of groove 3 of the adjacent support in order to interlock the assembly. Each part 4b of the connecting elements also has such an elastic tab which permits interlock in groove 3.

With this configuration, it is possible to assemble chains of component holders 1 or chains of blocks 2 composed of component holders 1 articulated against each other with flexible assembly elements. It is also possible to form packages of blocks 2, as the two packages 5 shown in FIG. 2, between which there are partially unfolded blocks 6, in turn interconnected by a block marked 2a placed on the assembly station 7 where the resonator assembly operations to be described below are executed.

The resonator illustrated in FIGS. 3 and 4, identified generally by number 8 is composed of a base 9 which holds two conductors 10 connected to two terminals 11, a quartz wafer 12 which cut in the shape of a tuning fork and which is attached to the two terminals 11 by welding or by gluing with a conductive epoxy glue to metallized areas not shown of the quartz wafer 12 and of a sleeve 13 of tubular shape which is press fitted to base 9 in order to protect the quartz wafer 12.

Each component holder 1 (FIG. 5) has a clamp composed of jaws 1c (FIG. 6), which are elastically deformable and which will accomodate a base 9 (FIG. 10); a terminal section 1d with two longitudinal passages 14 arranged at suitable angles to the longitudinal axis of the component holder which accomodate the conductors 10 of the resonator; two elements 1e (FIG. 8) which are elastically deformable and each of which have a support surface 15 which receive the split end of the quartz wafer 12 while the opposite end of the wafer is supported on terminals 11 of the base 9 clamped in jaws 1c (FIG. 10); a clamp formed by two jaws 1f (FIG. 7) which are elastically deformable and are designed to receive the sleeve 13; and an end section 1g which features a bore 16 to accomodate the far end of sleeve 13 held in jaws 1f.

It is to be noted that each component holder 1 has a recess 17 (FIG. 6) on its bottom side to allow positioning of the component holder on a table 7 (FIG. 2) during the resonator assembly operations. These recesses 17 indicated by dotted lines in FIG. 1 form a chain into which a sprocket wheel 18 schematically illustrated in FIG. 2 can engage. Recess 17 can be used to advance the chain of blocks 2 of component holders 1 and it can hold each component holder in the position needed when the resonator it holds is being assembled. The chain formed by the recesses 17 has the same pitch whether the component holders 1 are articulated directly by means of the tongues 1a which engage in groove 3 of the adjacent blocks or whether the component holders are composed of blocks as described in the example herein, assembled by connecting elements 4 as the length of these elements corresponds to that of a component holder. The pitch of the chain always remains the same and the sprocket wheel 18 engages into the recesses in such a manner that three teeth of the sprocket wheel are always engaged simultaneously. This configuration makes it possible to assemble resonators with fully automatic machines.

The assembly operation is effected as follows:

The component holders which constitute block 2a resting on table 7 (FIG. 2) first receive the individual bases 9 of the resonators; this is done by forcing each base from the top by exerting pressure in the direction indicated by arrow 19 of FIG. 6 into the circular receiving area 21 enclosed by jaws 1c; this is facilitated by the inclined faces 20 of jaws 1c which are spread as base 9 is being forced into position.

In the same manner, sleeve 13 is pressed into the space between jaws 1f; sleeve 13 is stopped by a rib 1h (FIG. 7) located between the two jaws 1f of component holder 1. If the quartz wafer is glued instead of being welded in place, glue can now be applied to terminals 11 of base 9 and then the quartz wafer 12 is placed on the support surfaces 15 of the parts 1e of the support and on terminals 11 of the base. The glue can now be dried by evacuation in a vacuum or by other processes.

The frequency of the quartz crystal is now adjusted by removal of the metallic coating material at certain locations by means of laser beam passes. For this frequency adjustment, it is necessary for the quartz crystal to oscillate freely; all external restraints must therefore be eliminated. For this purpose, the base areas of parts 1e of component holder 1 are tapered 1i (FIG. 8) which makes it possible to exert a force in the direction of arrow 22 on the inclined surfaces 23 of shoulders 1j of these parts 1e and consequently to displace these parts 1e in the direction of arrows 24. In such a manner, the quartz wafer 12 is released and is free of parts 1e. The pressure exerted on surfaces 23 can be maintained during the frequency adjustment operation or can be interrupted. If the force is to be interrupted, component holder 1 will be equipped with parts forming hooks which are not shown into which the shoulders 1j can engage and will thus remain spread apart to allow the quartz wafer to oscillate. The quartz excitation current will be applied to conductors 10 by contact pieces which are engaged in the transversal passage 25 provided in the terminal section 1d of component holder 1. The conductors 10 can rest against the base 26 of terminal section 1d. It should be noted that the component holders 1 have holes 27 (FIG. 8) to allow the laser beam used for the adjustment of the frequency of the quartz wafer to travel through the component holder at suitable locations. This provides for the use of a photoelectric cell located behind the quartz wafer 12 to determine exactly the moment in time when the laser beam pass must begin.

After the frequency has been adjusted, the resonator is encapsulated in a vacuum. For this purpose, an axial force is exerted on sleeve 13 at its far end as indicated by arrow 28 in FIG. 10 while parts 1e of the component holder remain spread apart. This moves the sleeve in translation towards the right in FIG. 10 until it contacts the abutment 29 formed by the back end of jaws 1c.

Sleeve 13 is now held in position by the plunger which moved it towards the right in FIG. 10. At the same time, an axial force is exerted on base 9 in the direction indicated by arrow 30 to engage the base in the sleeve. The plunger needed for this purpose passes between the conductors 10 which remain spread apart in the serrations 14 of part 1d of the component holder in which they are engaged.

The quartz wafer is now subject to an aging cycle and to a final verification of the resonant frequency, which can be modified by aging. The crystal resonators can be stored in the holders. THe resonators can then be supplied to the users still mounted in the blocks of component holder employed for their assembly in which case the component holder is not only used as an assembly fixture but also provides packaging functions. The resonators can also be removed from their holders and replaced into other, identical holders arranged according to performance classes.

The component holders function not only as assembly fixtures for the resonator assembly operation and as packaging elements but can also support the resonators as they are being used. The component holders can be mounted in electronic appliances—clock assemblies or other devices—in which resonators are used. The supports could also accomodate other elements such as trimmers, capacitors, or even integrated circuits; such additional elements would be mounted on the component holders at a later time.

It should be noted that the number of commponent holders 1 of each block 2 can be variable. It is conceivable that individual component holders can be connected to each other directly by their tongues 1a and grooves 3 or hinged to each other in succession with connecting elements 4. In this case, the component holders could be wound up on mandrels and would not need be arranged in packets, groups or blocks as shown in FIGS. 1 and 2.

What we claim is:

1. A device for assembling crystal resonators at an assembly station, each resonator being formed of constituent elements including a crystal, the device comprising:
    a plurality of component holders, each holder being provided with means for receiving said constituent elements, said means for receiving including elastically deformable jaws between which the constituent elements may be enaged;
    means for accurately positioning and indexing said component holders at said assembly station; and
    means for joining the individual component holders together in series.

2. The device as claimed in claim 1 in which at least one of said elastically deformable jaws provides for a translational displacement of the constituent element gripped thereby.

3. The device as claimed in claim 1 wherein the component holders each have a support section for accomodating the crystal of each of the resonators, said support section including two elastically deformable parts configured in such a manner that they can be spread apart to free the crystal.

4. The device as claimed in claim 3 wherein the commponent holders include holes to provide for the passage therethrough at suitable locations of a laser beam utilized for adjusting the resonator frequency.

5. The device as claimed in claim 1 wherein the means for indexing the component holders include means for advancing the component holder and for positioning each holder individually.

6. The device as claimed in claim 1 wherein at least portions of the component holders are arranged for accomodating the assembled resonators and so that the holders may be used as a packaging element for the resonators.

7. The device as claimed in claim 1 wherein some of said means for joining the component holders together rigidly join the component holders together to form blocks of individual holders.

8. The device as claimed in claim 1 wherein some of said means for joining the component holders together are flexible to form chains.

9. The device as claimed in claim 7 or 8 wherein some of said means for joining are rigid and some are flexible so that the individual component holders form blocks of component holders hinged flexibly together to form chains.

10. A method for assembling and packaging crystal resonators at an assembly station, each resonator being formed of constituent elements including a crystal comprising the steps of
    engaging the constituent elements of the crystal resonators between elastically deformable jaws of component holders forming blocks hinged in chains, said holders positioning said elements at the assembly station;
connecting at least some of said elements together;
adjusting the frequency of the crystals;
encapsulating the resonators;
removing the blocks of component holders from the assembly station; and
storing said crystal resonator in said component holders.

* * * * *